(12) United States Patent
Lee

(10) Patent No.: US 10,049,743 B2
(45) Date of Patent: Aug. 14, 2018

(54) SEMICONDUCTOR DEVICE AND METHOD OF MANUFACTURING THE SAME

(71) Applicant: SK hynix Inc., Icheon-si, Gyeonggi-do (KR)

(72) Inventor: Nam Jae Lee, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 52 days.

(21) Appl. No.: 15/341,771

(22) Filed: Nov. 2, 2016

(65) Prior Publication Data

US 2017/0358356 A1 Dec. 14, 2017

(30) Foreign Application Priority Data

Jun. 9, 2016 (KR) ........................ 10-2016-0071720

(51) Int. Cl.
| | |
|---|---|
| *G11C 8/08* | (2006.01) |
| *G11C 16/10* | (2006.01) |
| *G11C 16/04* | (2006.01) |
| *G11C 16/14* | (2006.01) |
| *G11C 16/26* | (2006.01) |
| *H01L 23/528* | (2006.01) |
| *H01L 27/11556* | (2017.01) |
| *H01L 27/11582* | (2017.01) |
| *H01L 29/04* | (2006.01) |
| *H01L 29/16* | (2006.01) |
| *H01L 29/51* | (2006.01) |

(52) U.S. Cl.
CPC .......... *G11C 16/0483* (2013.01); *G11C 16/14* (2013.01); *G11C 16/26* (2013.01); *H01L 23/528* (2013.01); *H01L 27/11556* (2013.01); *H01L 27/11582* (2013.01); *H01L 29/04* (2013.01); *H01L 29/16* (2013.01); *H01L 29/517* (2013.01)

(58) Field of Classification Search
CPC . G11C 16/0483; G11C 11/5642; G11C 16/26; G11C 2213/71; G11C 16/0458; G11C 8/08; G11C 16/10
See application file for complete search history.

(56) References Cited

U.S. PATENT DOCUMENTS

| | | | | |
|---|---|---|---|---|
| 2012/0295409 | A1* | 11/2012 | Yun | H01L 27/11582 438/268 |
| 2013/0153983 | A1* | 6/2013 | Jeon | H01L 29/66833 257/324 |
| 2015/0287739 | A1* | 10/2015 | Lee | H01L 27/11575 257/326 |
| 2016/0247576 | A1* | 8/2016 | Park | G11C 16/26 |
| 2016/0365354 | A1* | 12/2016 | Lee | H01L 27/11582 |
| 2017/0141032 | A1* | 5/2017 | Lee | H01L 23/5226 |

FOREIGN PATENT DOCUMENTS

| | | |
|---|---|---|
| KR | 1020150129940 A | 11/2015 |
| KR | 1020170089378 A | 8/2017 |

* cited by examiner

*Primary Examiner* — Hien Nguyen
(74) *Attorney, Agent, or Firm* — William Park & Associates Ltd.

(57) ABSTRACT

A semiconductor device may be provided. The semiconductor device may include a sub-channel layer located over a conductive layer. The semiconductor device may include a hole source layer interposed between the conductive layer and the sub-channel layer. The semiconductor device may include source select lines located over the sub-channel layer. The semiconductor device may include source channel layers contacting the sub-channel layer by penetrating the source select lines.

12 Claims, 15 Drawing Sheets

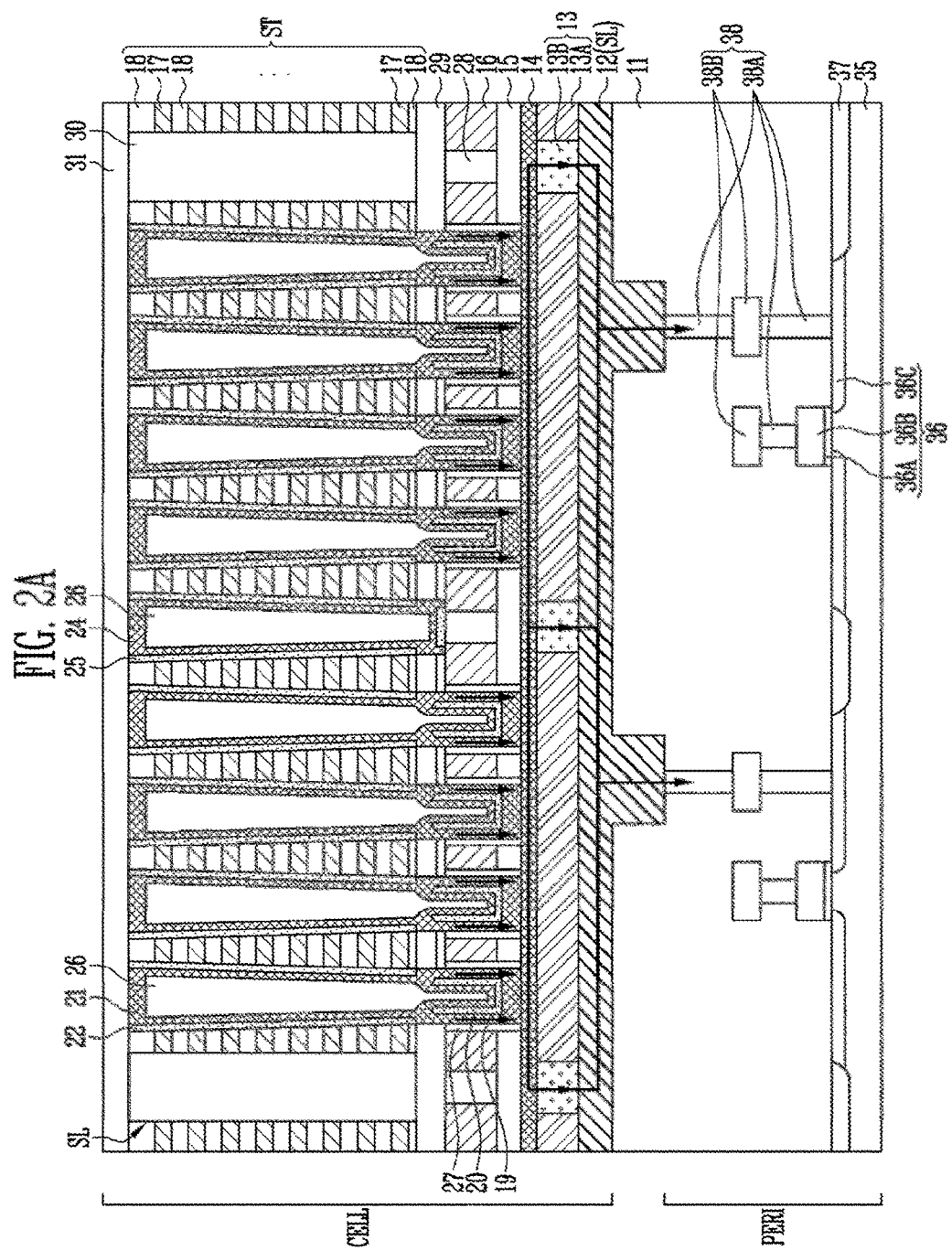

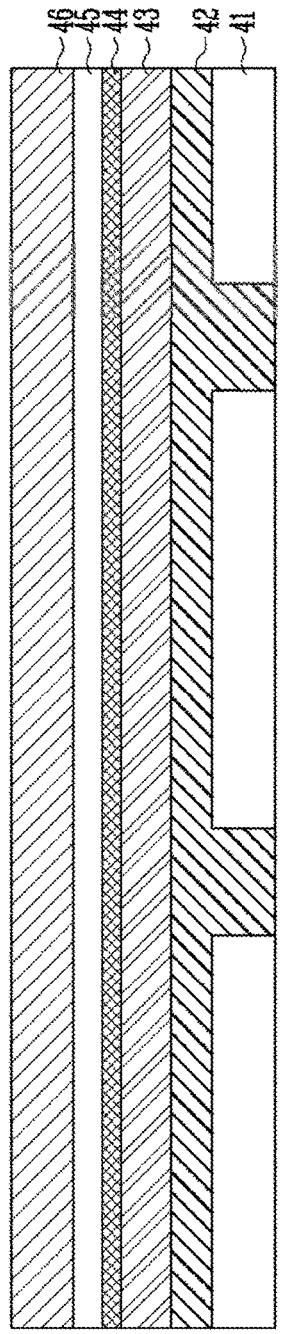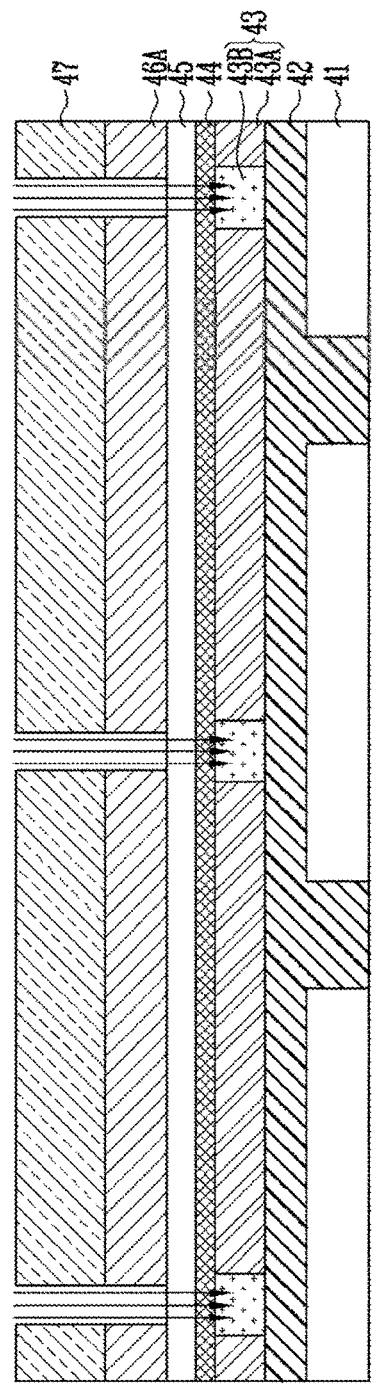

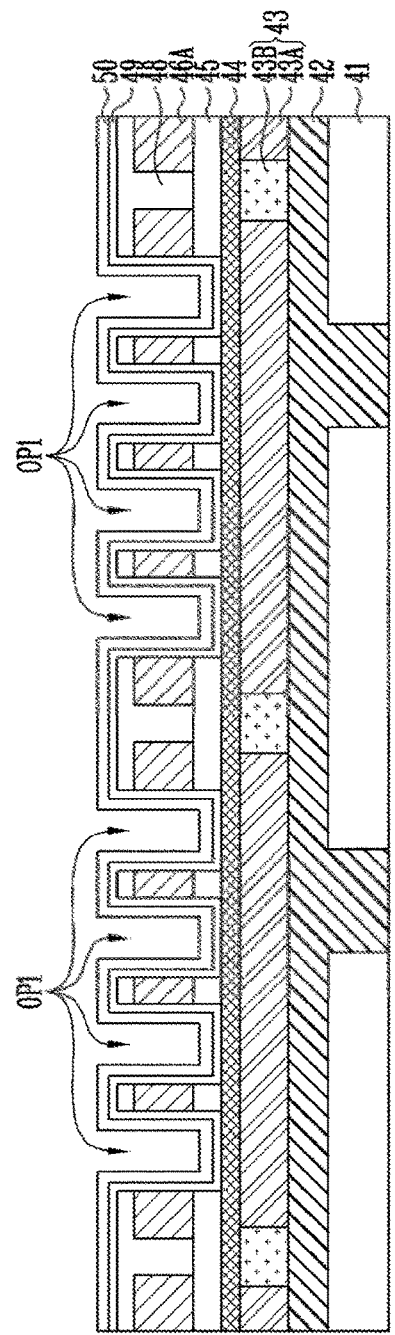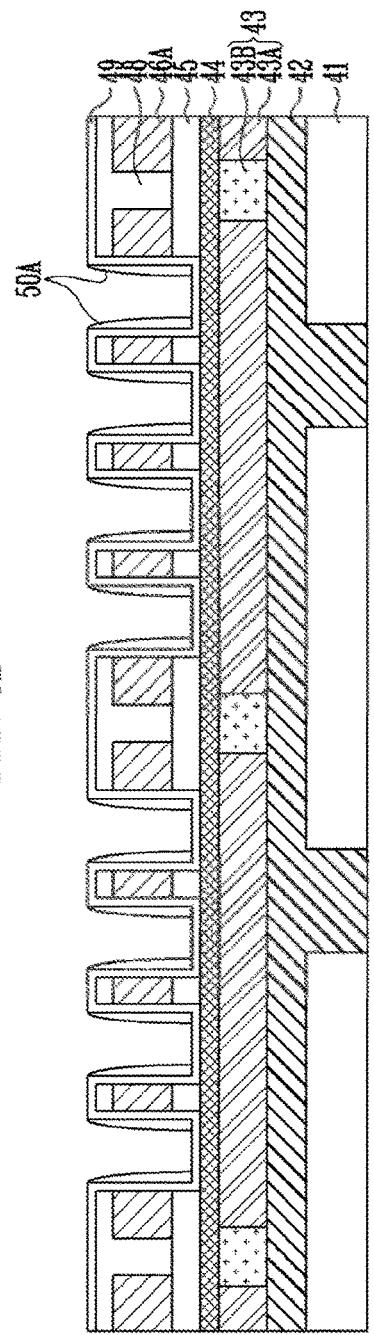

SEMICONDUCTOR DEVICE AND METHOD OF MANUFACTURING THE SAME

CROSS-REFERENCE TO RELATED APPLICATION

The present application claims priority under 35 U.S.C. § 119(a) to Korean patent application number 10-2016-0071720 filed on Jun. 9, 2016 in the Korean Intellectual Property Office, the entire disclosure of which is incorporated herein by reference.

BACKGROUND

1. Technical Field

Embodiments of the present disclosure may generally relate to an electronic device and a method of manufacturing the same, and more particularly, to a three-dimensional semiconductor device and a method of manufacturing the same.

2. Related Art

Nonvolatile memory devices are memory devices which retain stored data, as it is, even when a power supply is cut off. As improvements for the degree of integration of two-dimensional nonvolatile memory devices in which memory cells are formed in a single layer on a substrate reaches a limit, there has recently been proposed a three-dimensional nonvolatile memory device in which memory cells are vertically stacked on a substrate.

The three-dimensional nonvolatile memory device consists of interlayer insulating layers and gate electrodes, which are alternately stacked, channel layers penetrating the interlayer insulating layers and the gate electrodes, and memory cells stacked along the channel layers. Various structures and manufacturing methods have been developed to improve the operational reliability of the three-dimensional non-volatile memory device.

SUMMARY

According to an aspect of the present disclosure, there may be provided a semiconductor device. The semiconductor device may include a sub-channel layer located over a first conductive layer. The semiconductor device may include a hole source layer interposed between the first conductive layer and the sub-channel layer. The semiconductor device may include source select lines located over the sub-channel layer. The semiconductor device may include source channel layers contacting the sub-channel layer by penetrating the source select lines.

According to an aspect of the present disclosure, there may be provided a method of manufacturing a semiconductor device. The method may include forming first openings penetrating source select lines. The method may include forming source channel layers in the first openings. The method may include forming a sacrificial layer over the source select lines. The method may include forming a stack structure on the sacrificial layer. The method may include forming cell channel layers penetrating the stack structure and the sacrificial layer. The cell channel layers may extend to the inside of the source channel layers.

BRIEF DESCRIPTION OF THE DRAWINGS

FIGS. 2A and 2B are sectional views illustrating representations of examples of a structure and a driving method of the semiconductor device according to an embodiment of the present disclosure.

FIGS. 3A to 3J are layouts and sectional views illustrating a representation of an example of a method of manufacturing a semiconductor device according to an embodiment of the present disclosure.

DETAILED DESCRIPTION

Figure 1A:
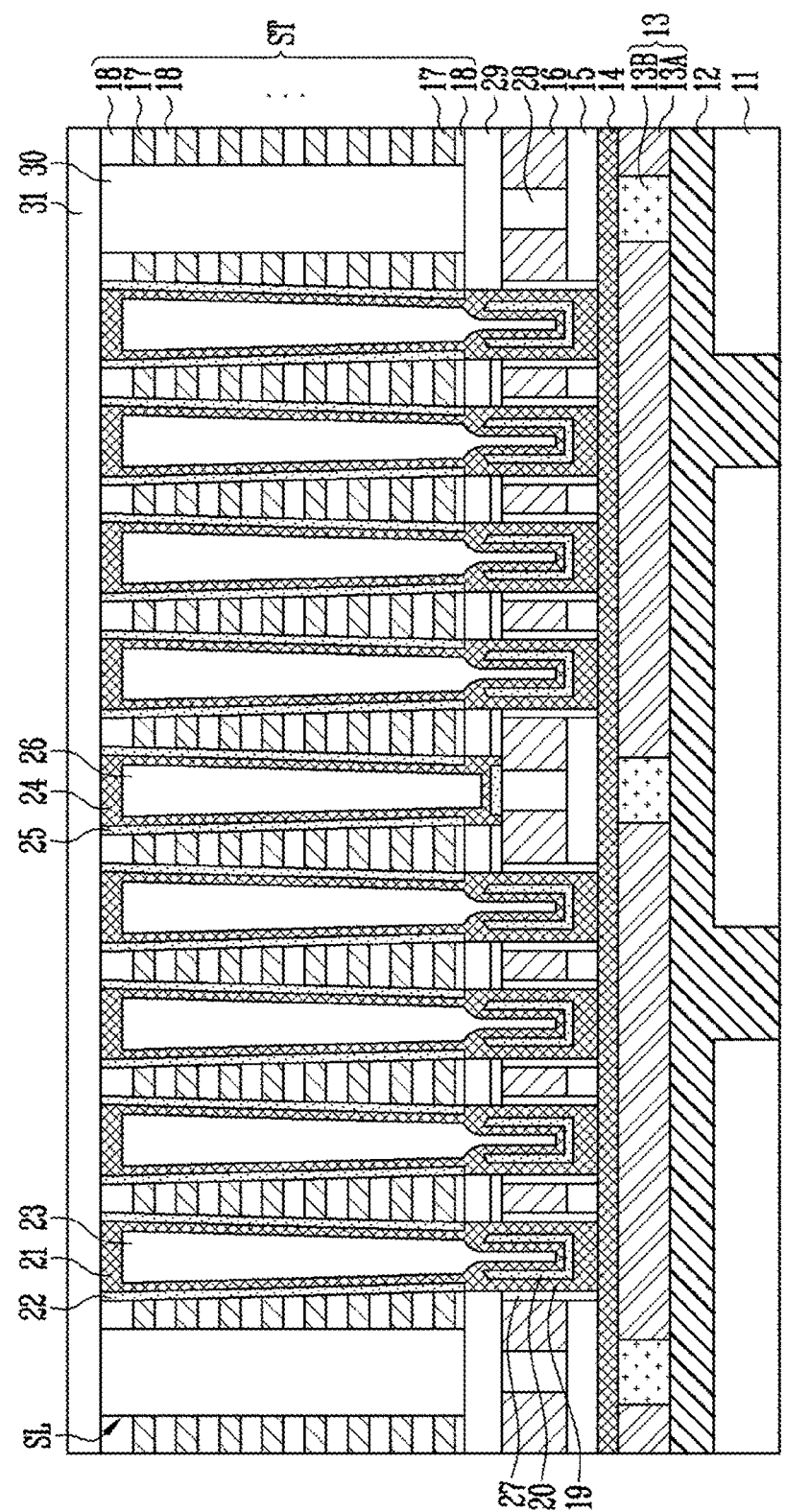
FIG. 1A is a sectional view illustrating a representation of an example of a structure of a semiconductor device according to an embodiment of the present disclosure.

Example embodiments of the present disclosure will be described with reference to the accompanying drawings. The examples of embodiments of the present disclosure may, however, be embodied in many different forms and should not be construed as limited to the example embodiments set forth herein. Rather, the examples of embodiments are provided so that disclosure of the present disclosure will be thorough and complete, and will fully convey the scope of the present disclosure to those skilled in the art. The features of examples of embodiments of the present disclosure may be employed in various and numerous embodiments without departing from the scope of the present disclosure. In the drawings, the size and relative sizes of layers and areas may be exaggerated for clarity. The drawings are not to scale. It will be understood that when an element is referred to as being "between" two elements, it can be the only element between the two elements, or one or more intervening elements may also be present. Like reference numerals refer to like elements throughout.

Embodiments may provide a semiconductor device which is easily manufactured and has a stable structure and improved characteristics and a method of manufacturing the semiconductor device.

FIG. 1A is a sectional view illustrating a representation of an example of a structure of a semiconductor device according to an embodiment of the present disclosure.

Referring to FIG. 1A, a semiconductor device according to an embodiment of the present disclosure includes a conductive layer 12 for source and bulk lines, a hole source layer 13, a sub-channel layer 14, source select lines 16, and source channel layers 19.

The conductive layer 12 may be a multi-functional conductive layer used as a source line, a bulk line, etc. The conductive layer 12 may be a polysilicon layer or a metal layer. For example, the conductive layer 12 may include polysilicon, tungsten W, tungsten nitride $WN_x$, titanium Ti, titanium nitride TiN, tantalum, tantalum nitride TaN, cobalt silicide $CoSi_x$, nickel silicide $NiSi_x$, tungsten silicide $WN_x$, etc. Also, the conductive layer 12 may be connected to a circuit (not illustrated) thereunder by penetrating an interlayer insulating layer 11, or may be connected to a line (not illustrated) there over through a slit SL.

The hole source layer 13 is located on the conductive layer 12, and may be interposed between the conductive layer 12 and the sub-channel layer 14. The hole source layer 13 may include a hole source 13A for supplying holes and an impurity region 13B for providing a current path. Here, the hole source layer 13 may be a polysilicon layer, and may include impurities of different types depending on regions. For example, the hole source 13A includes a P-type impurity, and the impurity region 13B includes an N-type impurity.

The sub-channel layer 14 is located on the hole source layer 13 and directly contacts the source channel layers 19. Thus, a current path between the source channel layers 19 and the conductive layer 12 can be provided through the sub-channel layer 14. For example, the sub-channel layer 14 may be an undoped polysilicon layer.

The source select lines 16 are located on the sub-channel layer 14, and may be located at the substantially same level or stacked in multiple layers. Source select lines 16 which are located at the same level and adjacent in the horizontal direction are insulated from each other by insulating patterns 28. In addition, an insulating layer 15 may be interposed between the sub-channel layer 14 and the source select lines 16 such that the sub-channel layer 14 and the source select lines 16 are insulated from each other. Here, for example, the term "substantially same" means not only that numerical values correspond to each other but also that the numerical values are within a range including errors in processes.

The source channel layers 19 contacts the sub-channel layer 14 by penetrating the source selection lines 16 and an insulating layer 15. Thus, the conductive layer 12, the hole source layer 13, the sub-channel layer 14, and the source channel layers 19 sequentially contact each other, and a current path can be formed therebetween.

Gate insulating patterns 27 are interposed between the source channel layers 19 and the source select lines 16. The gate insulating pattern 27 may include oxide. For example, the gate insulating pattern 27 may be an $Al_2O_3$ layer. In addition, each of the source channel layers 19 may include a dummy memory pattern 20 isolated thereinside.

The semiconductor device may further include a stack structure ST located over the source select lines 16. The stack structure ST includes conductive layers 17 and insulating layers 18, which are alternately stacked. Here, the conductive layers 17 may be word lines or drain select lines. For example, at least one uppermost conductive layer 17 among the conductive layers 17 may be a drain select line, and the other conductive layers 17 may be word lines. An insulating layer 29 may be interposed between the stack structure ST and the source select line 16.

The semiconductor device may further include cell channel layers and dummy cell channel layers 24, which penetrate the stack structure ST in the stacking direction of the stack structure ST. The cell channel layers 21 penetrate the stack structure ST in the stacking direction, and may extend to the inside of the source channel layer 19. Here, a region extending to the inside of the source channel layer 19 may be located inside the dummy memory pattern 20. Memory layers 22 may be formed on sidewalls of the cell channel layers 21, and gap fill layers 23 may be filled in the cell channel layers. For example, the memory layer 22 may include at least one of a charge blocking layer, a data storage layer, and a tunnel insulating layer, and the data storage layer may include a floating gate material such as silicon, a charge trap material such as nitride, a phase change material, nano-dots, etc.

The dummy cell channel layers 24 are located between adjacent cell channel layers 21, and may be formed in a structure similar to that of the cell channel layers 21. However, the dummy cell channel layers 24 are formed to have a shallower depth than the cell channel layers 21, and may be formed to have a depth at which the dummy cell channel layers 24 do not penetrate the source select lines 16. For example, the dummy cell channel layers 24 may be located over the insulating patterns 28. Dummy memory layers 25 may be formed on sidewalls of the dummy cell channel layers 24, and dummy gap fill layers 26 may be filled in the dummy cell channel layers 24. For example, the dummy memory layer 25 may have a structure and a material, which are similar to those of the memory layer 22. The dummy memory layer 25 may include at least one of a charge blocking layer, a data storage layer, and a tunnel insulating layer.

The stack structure ST may include the slit SL. The slit SL penetrates the stack structure in its stacking direction, and an insulating pattern 28 and the impurity region 13B may be located under the slit SL. A slit insulating layer 30 may be formed in the slit SL. In addition, an interlayer insulating layer 31 may be formed on the stack structure ST. Here, the slit insulating layer 30 and the interlayer insulating layer 31 may constitute one layer in which they are integrally connected.

Figure 1B:
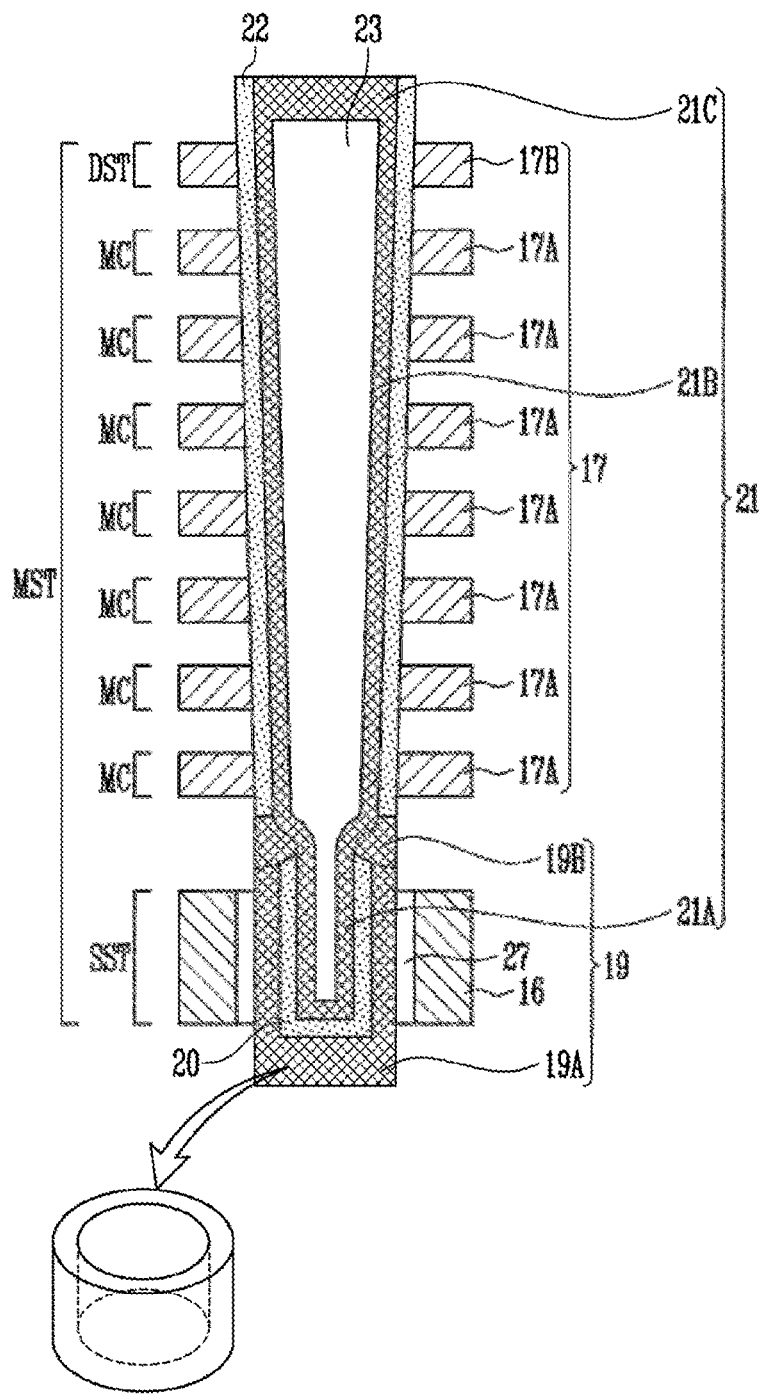
FIG. 1B is a sectional view illustrating a representation of an example of a structure of a vertical memory string according to an embodiment of the present disclosure.

FIG. 1B is a sectional view illustrating a representation of an example of a structure of a vertical memory string according to an embodiment of the present disclosure.

Referring to FIG. 1B, the vertical memory string MST according to an embodiment of the present disclosure includes at least one source select transistor SST, a plurality of memory cells MC, and at least one drain select transistor DST, which are connected in series. The plurality of memory cells MC may be vertically stacked, and the vertical memory string may be vertically disposed.

Here, a cell channel layer 21 includes a channel region 21b used as a channel of the memory cell MC or the drain select transistor DST, a pad region 21C used as a contact pad for connection with a bit line (not illustrated), and a dummy region 21A buried into a source channel layer 19. A gap fill layer 23 may be formed inside the channel region 21B. The gap filly layer 23 may also be formed inside the dummy region 21A. A conductive layer 17 may be a gate electrode 17A of the memory cell MC or a gate electrode 17B of the drain select transistor DST.

The source channel layer 19 may include a channel pattern 19A, a connecting pattern 19B connecting the channel pattern 19A and the cell channel layer 21 to each other, and a dummy memory pattern 20 in the channel pattern 19A. Here, the channel pattern 19A and the dummy memory pattern 20 may have a bowl shape.

Since the dummy region 21A of the cell channel layer 21 is located in the source select transistor SST, the dummy region 21A may be a dummy channel pattern that is a portion of the source channel layer 19. Also, the dummy region 21A may have a bowl shape. Therefore, the source channel layer 19 may include the channel pattern 19A, the dummy memory pattern 20, the dummy region 21A, and the connecting pattern 19B. Also, the dummy memory pattern 20 is completely surrounded by the connecting pattern 19B, the channel pattern 19A, and the dummy region 21A, and has an isolated shape.

According to the above-described structure, the source select transistor SST includes a gate insulating pattern 27 interposed between the channel pattern 19A and a gate electrode 16. Thus, unlike the memory cell MC, a memory layer is not interposed between the channel pattern 19A and the gate electrode 16.

Figure 1C:
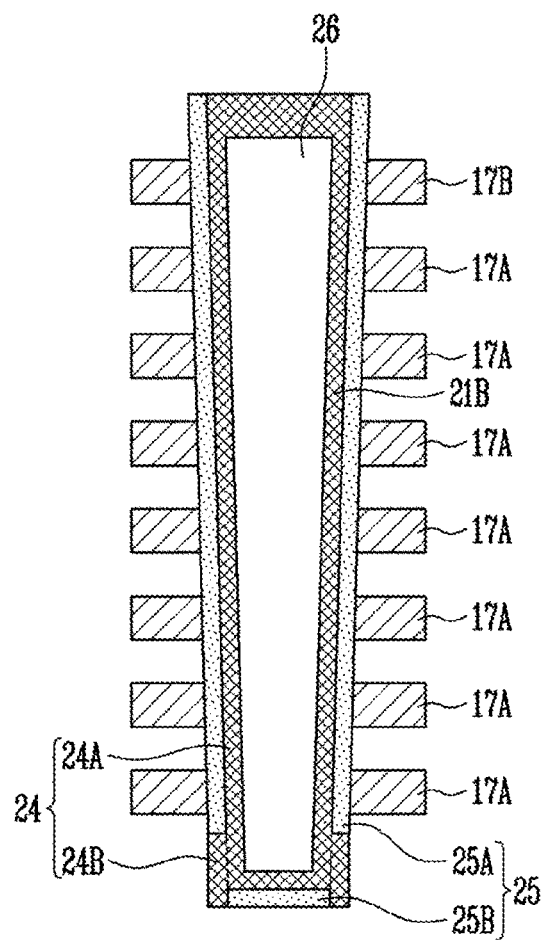
FIG. 1C is a sectional view illustrating a representation of an example of a structure of a dummy cell channel layer according to an embodiment of the present disclosure.

FIG. 1C is a sectional view illustrating a representation of an example of a structure of a dummy cell channel layer according to an embodiment of the present disclosure.

Referring to FIG. 1C, a dummy cell channel layer 24 includes a penetration region 24A penetrating the stack structure ST and a protruding region 24B protruding from an outer wall of the penetration region 24A. Here, the protruding region 24B may be located at the substantially same level as the connecting pattern 19B described above. A dummy memory layer 25 may include a first region 25A surrounding the penetration region 24A of the dummy cell channel layer 24 and a second region 25B located under the penetration region 24A. The first region 25A and the second region 25B may be isolated from each other by the protruding region 24B.

Figure 2B:
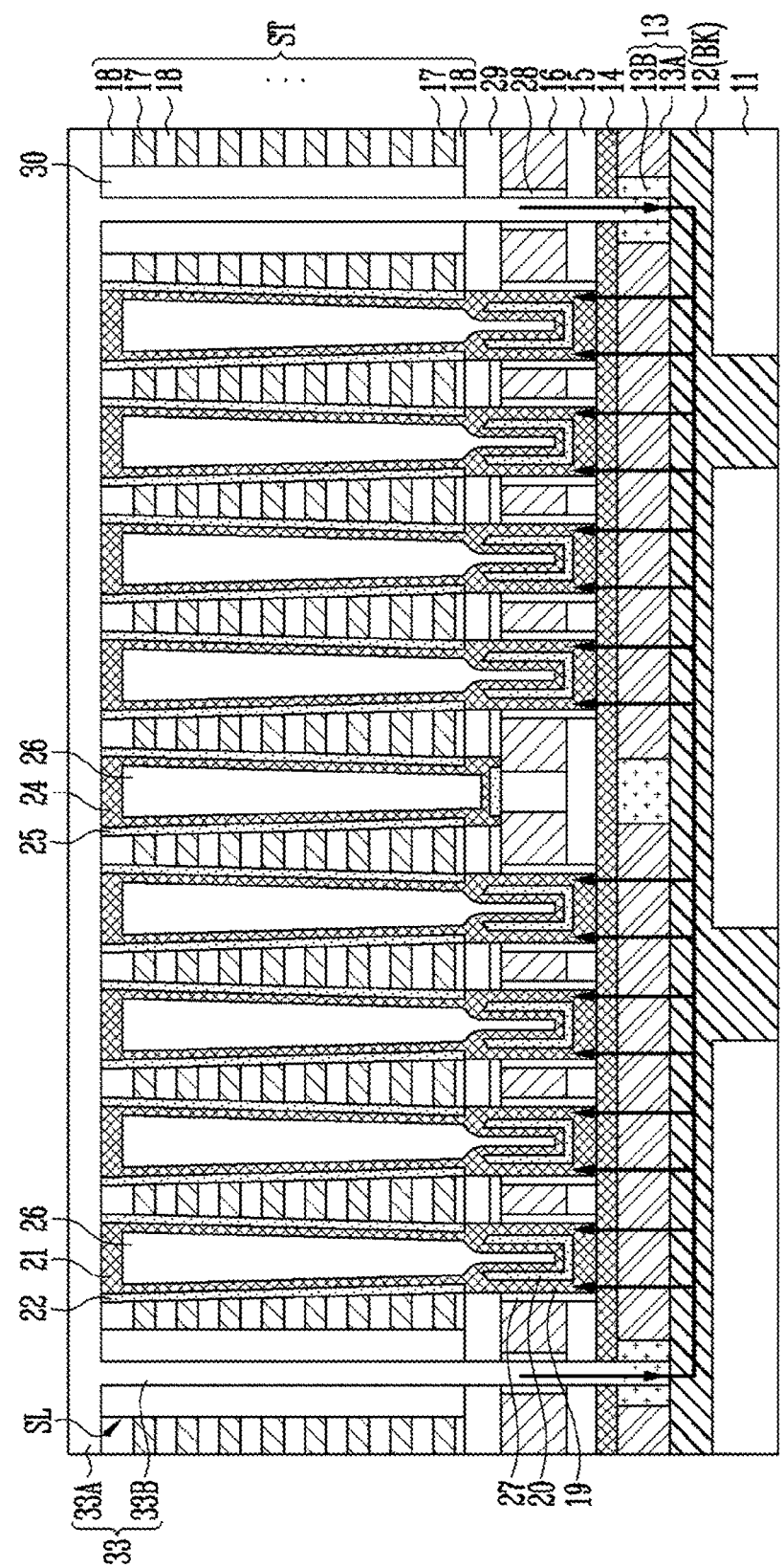

FIGS. 2A and 2B are sectional views illustrating representations of examples of a structure and a driving method of the semiconductor device according to an embodiment of the present disclosure.

Referring to FIG. 2A, the semiconductor device according to an embodiment of the present disclosure may include a cell region CELL and a peripheral region PERI located under the cell region CELL. The stack structure ST described with reference to FIGS. 1A to 1C may be located in the cell region CELL. A circuit for driving memory strings is located in the peripheral region PERI.

The circuit includes a transistor 36, a resistor, capacitor, and the like, which are located on a substrate 35, and the circuit and the memory strings are electrically connected to each other by an interconnection 38. For example, an active region is defined by a device isolation layer 37 in the substrate 35, and the transistor 36 is located in the active region of the substrate 35. The transistor 36 may include a gate electrode 36B on the substrate 35, a gate insulating layer 36A interposed between the substrate 35 and the gate electrode 36B, and a junction 36C in the substrate 35. The interconnection 38 may include contact plugs 38A and lines 38B, which are connected to the gate electrode 36B or the junction 36C of the transistor 36.

The transistor 36 is controlled to supply a bias to a conductive layer 12 or ground the conductive layer 12 during a read or program operation. The conductive layer 12 is electrically connected to the junction 36C of the transistor 36 by the interconnection 38. Thus, during a read operation, the conductive layer 12 can be grounded by turning on the transistor 36. For example, if the transistor 36 is turned on, a current path passing through a source channel layer 19, a sub-channel layer 14, an impurity region 13B, the conductive layer 12, the interconnection 38, and the junction 36C is generated. The conductive layer 12 may be a source line SL.

Referring to FIG. 2B, the semiconductor device according to an embodiment of the present disclosure may include an interconnection 33 electrically connected to the conductive layer 12 through a slit SL. The interconnection 33 may include a line 33A located over the stack structure ST and a vertical structure 33B electrically connecting the line 33A and the conductive layer 12 to each other. Here, the vertical structure 33B may have various shapes such as a plug shape and a line shape. The vertical structure 33B may be located in the slit SL. Thus, during an erase operation, an erase bias is applied to the conductive layer through the interconnection 33, holes are generated from a hole source 13A contacting the conductive layer 12, and the generated holes are supplied into a channel pattern 18 through a connecting layer 14. The conductive layer 12 may be a bulk line BK.

According to an above-described driving method, the conductive layer 12 may have a dual function. During a program or read operation, the conductive layer 12 serves as the source line SL for forming a current path. Also, during an erase operation, the conductive layer 12 serves as the bulk line BK to which an erase voltage is applied. Accordingly, a path through which holes are supplied in the erase operation and a path through which current flows in the read operation are isolated from each other, so that one conductive layer 12 can be used as source and bulk lines.

FIGS. 3A to 3J are layouts and sectional views illustrating a representation of an example of a method of manufacturing a semiconductor device according to an embodiment of the present disclosure.

Referring to FIG. 3A, a conductive layer 42 is formed on an insulating layer 42. The conductive layer 42 may be used as source and bulk lines, and may be electrically connected to a circuit under the insulating layer 41 through a contact plug penetrating the insulating layer 41. The conductive layer 42 may include a metal layer and a barrier metal surrounding the metal layer. For example, the metal layer may include tungsten, and the barrier metal may include titanium nitride.

Subsequently, a hole source layer 43, a sub-channel layer 44, an insulating layer 45, and a conductive layer 46 for source select lines are sequentially formed on the conductive layer 42. For example, the hole source layer 43 may be a polysilicon layer including a P-type impurity, and the sub-channel layer 44 may be an undoped polysilicon layer. The insulating layer 45 may be an oxide layer, and the conductive layer 46 for source select lines may be a metal layer.

Referring to FIG. 3B, a mask pattern 47 is formed on the conductive layer 46 for source select lines. The mask pattern 47 may be a photoresist pattern. Subsequently, the conductive layer 46 for source select lines is etched using the mask pattern 47 as a barrier, thereby forming source select lines 46A. Subsequently, an impurity may doped into the hole source layer 43 through a gap between adjacent source select lines 46A, thereby forming an impurity region 43B. For example, when the hole source layer 43 includes a P-type dopant, the impurity region 43B including an N-type impurity may be formed. Accordingly, the hole source layer 43 includes a P-type hole source 43A and an N-type impurity region 43B.

Referring to FIG. 3C, an insulating layer 48 is formed to be filled in the gaps between the adjacent source select lines 46A. The insulating layer 48 may also be formed over the source select lines 46A. Subsequently, the insulating layer 48 is planarized to have a flat top surface.

Subsequently, first openings OP1 penetrating the source select lines 46A are formed. The first openings OP1 may penetrate the insulating layer 45 to expose the sacrificial layer 44 there through. Also, the first openings OP1 may have a circular section, an elliptical section, a quadrangular section, a polygonal section, or the like. Subsequently, a gate insulating layer 49 and a protective layer 50 are formed along a profile of the source select lines 46A including the first openings OP1. For example, the gate insulating layer 49 may include a dielectric material having a high dielectric constant, such as $Al_2O_3$. The protective layer 50 may include oxide formed at an ultra-low temperature, e.g., ultra low temperature oxide (ULTO). The protective layer 50 may be formed to have a thicker thickness than the gate insulating layer 49.

Referring to FIG. 3D, the protective layer 50 is partially etched, thereby forming a spacer 50A on inner walls of the first openings OP1. For example, regions of the protective layer 50, which are formed on bottom surfaces of the first openings OP1, are etched using an etch-back process, thereby forming the spacer 50A. Accordingly, regions of the gate insulating layer 49, which formed on the bottom surfaces of the first openings OP1, are exposed, and regions of the gate insulating layer 49, which are formed on the inner walls of the first openings OP1, are protected by the spacer 50A.

Figure 3E:
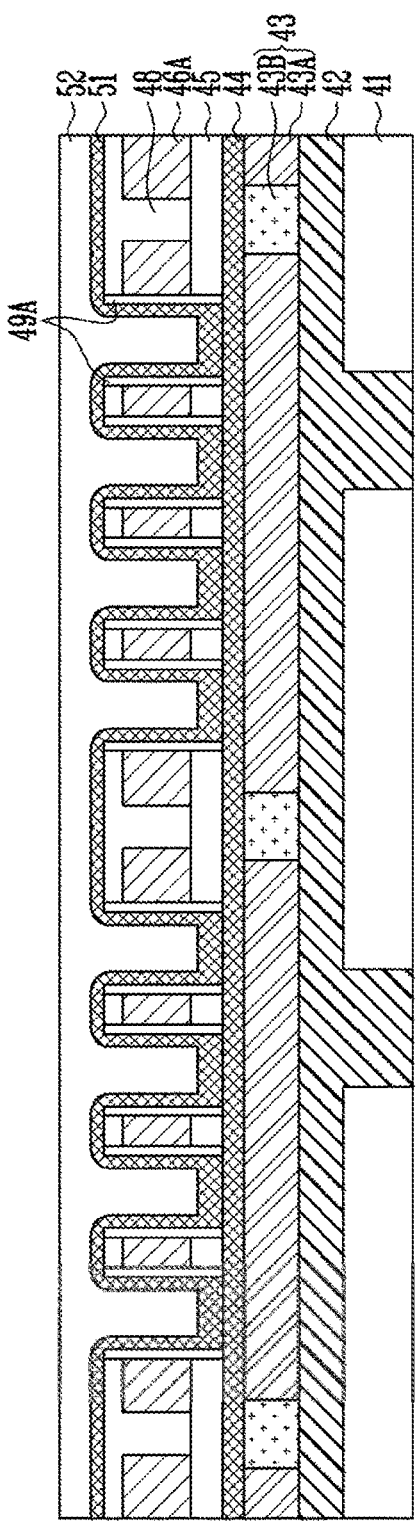

Referring to FIG. 3E, the gate insulating layer 49 is etched using the spacer 50A as a barrier, thereby forming gate insulating patterns 49A on the inner walls of the first openings OP1. Subsequently, the spacer 50A is removed. For example, the gate insulating layer 49 is etched through a wet etching process, and the spacer 50A is then removed through a cleaning process.

Subsequently, a channel layer 51 for source select transistors is formed along a profile of the first openings OP1 having the gate insulating patterns 49A formed therein. For example, the channel layer 51 for source select transistors may include a polysilicon. Subsequently, a sacrificial layer 52 is formed to be filled in the first openings OP1. The sacrificial layer 52 may include a material having a higher etch selectivity with respect to the channel layer 51 for source select transistors. The sacrificial layer 52 may include a titanium (Ti), titanium nitride (TiN), tantalum (Ta), tantalum nitride (TaN), etc.

Figure 3F:
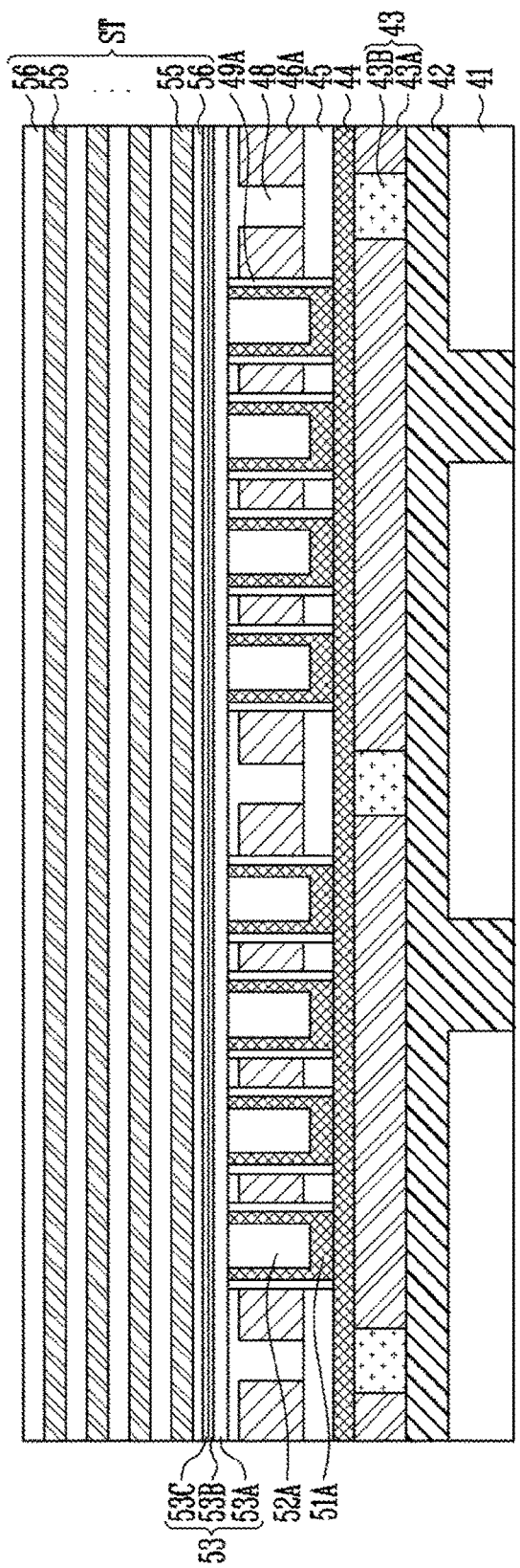

Referring to FIG. 3F, the sacrificial layer 52 and the channel layer 51 for source select transistors are planarized until an upper surface of the insulating layer 48 is exposed, thereby forming sacrificial patterns 52A and source channel layers 51A in the first openings OP1. For example, the planarization process may be performed using a chemical mechanical planarization (CMP) process. The source channel layers 51A may have a bowl shape.

Subsequently, a sacrificial layer 53 is formed. The sacrificial layer 53 may be formed in a single layer or multiple layers. For example, the sacrificial layer 53 may include a buffer layer 53A, a sacrificial layer 53B, and an etch stop layer 53C, which are sequentially stacked. For example, the buffer layer 53A may be an oxide layer, the sacrificial layer 53B may be a polysilicon layer, and the etch stop layer 53C may be an aluminum oxide layer ($Al_2O_3$).

Subsequently, a stack structure ST in which first material layers 55 and second material layers 56 are alternately stacked is formed on the sacrificial layer 53. The first material layers 55 may be used to form conductive layers such as word lines and drain select lines, and the second material layers 56 may be used to insulate the stacked conductive layers from each other.

For example, the first material layers 55 are formed of a material having a higher etch selectivity with respect to the second material layers 56. As an example, the first material layers 55 may include a sacrificial material such as nitride, and the second material layers 56 may include an insulating material such as oxide. As another example, the first material layers 55 may include a conductive material such as polysilicon or tungsten, and the second material layers 56 may include an insulating material such as oxide. As still another example, the first material layers 55 may include a conductive material such as doped polysilicon, and the second material layers 56 may include a sacrificial material such as undoped polysilicon.

Figure 3G:
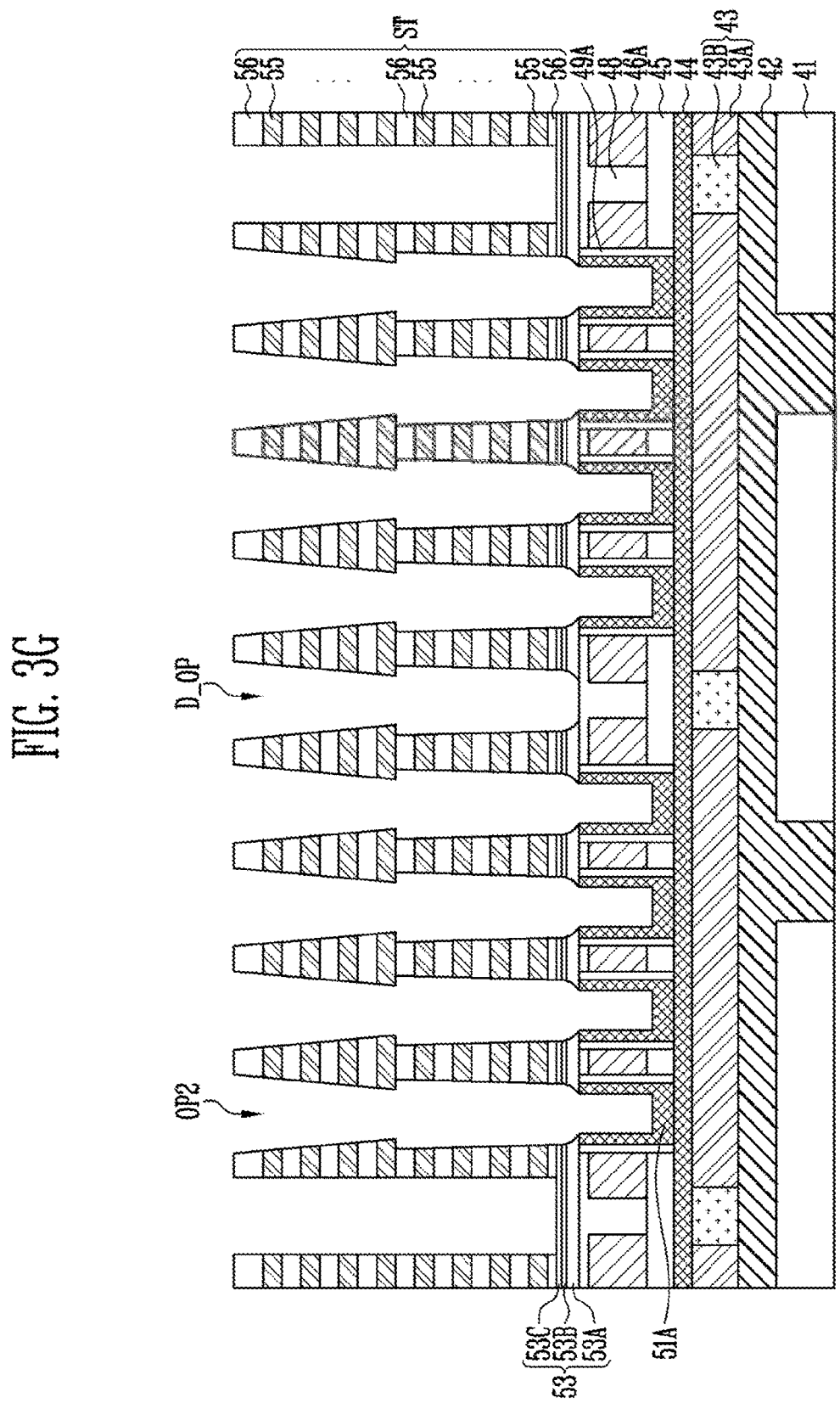

Referring to FIG. 3G, second openings OP2 are formed, which penetrate the stack structure ST and expose the sacrificial patterns 52A therethrough. Subsequently, the sacrificial patterns 52A are removed through the second openings OP2, thereby exposing the first source channel layers 51A. Accordingly, the second openings OP2 are formed, which penetrate the stack structure ST and the source select lines 46A.

In this case, after the second openings OP2 exposing the etch stop layer 53C therethrough is formed by etching the stack structure ST, the etch stop layer 53C may be removed through a cleaning process, thereby exposing the sacrificial patterns 52A. Thus, the second openings OP2 have a uniform depth.

In addition, a dummy opening D_OP located between the second openings OP2 may be formed. The dummy opening D_OP may have a shallower depth than the second openings OP2. For example, the dummy opening D_OP is located between adjacent source select lines 46A, and may expose the insulating layer 48 between the source select lines 46A therethrough. In this case, since the sacrificial patterns 52A are not removed through the dummy opening D_OP, the dummy opening D_OP has a shallower depth than the second openings OP2. For example, the dummy opening D_OP may be formed together with the second openings OP2 when the second openings OP2 are formed.

For reference, the stack structure ST and the second openings OP2 may be sequentially formed over a plurality of numbers of times. For example, the second openings OP2 penetrating the first material layers 55 and the second material layers 56 are formed, and sacrificial layers are then filled in the second openings OP2. Here, the sacrificial layers may include a material having a higher etch selectivity with respect to the first and second material layers 55 and 56. The sacrificial layers may include a tungsten layer and a titanium nitride layer surrounding the tungsten layer. Subsequently, after the first and second material layers 55 and 56 are formed, second openings OP2 connected to the previously formed second openings OP2 are additionally formed. Subsequently, the sacrificial layers are removed through the additionally formed openings OP2. In this figure, it is illustrated that the stack structure ST and the second openings OP2 are sequentially formed over twice. However, the present disclosure is not limited thereto, and the stack structure ST and the second openings OP2 may be sequentially formed over three times or more. When bumps exist in finally formed second openings OP2, an etch-back process may be performed such that the second openings OP2 have a uniform width.

Figure 3H:
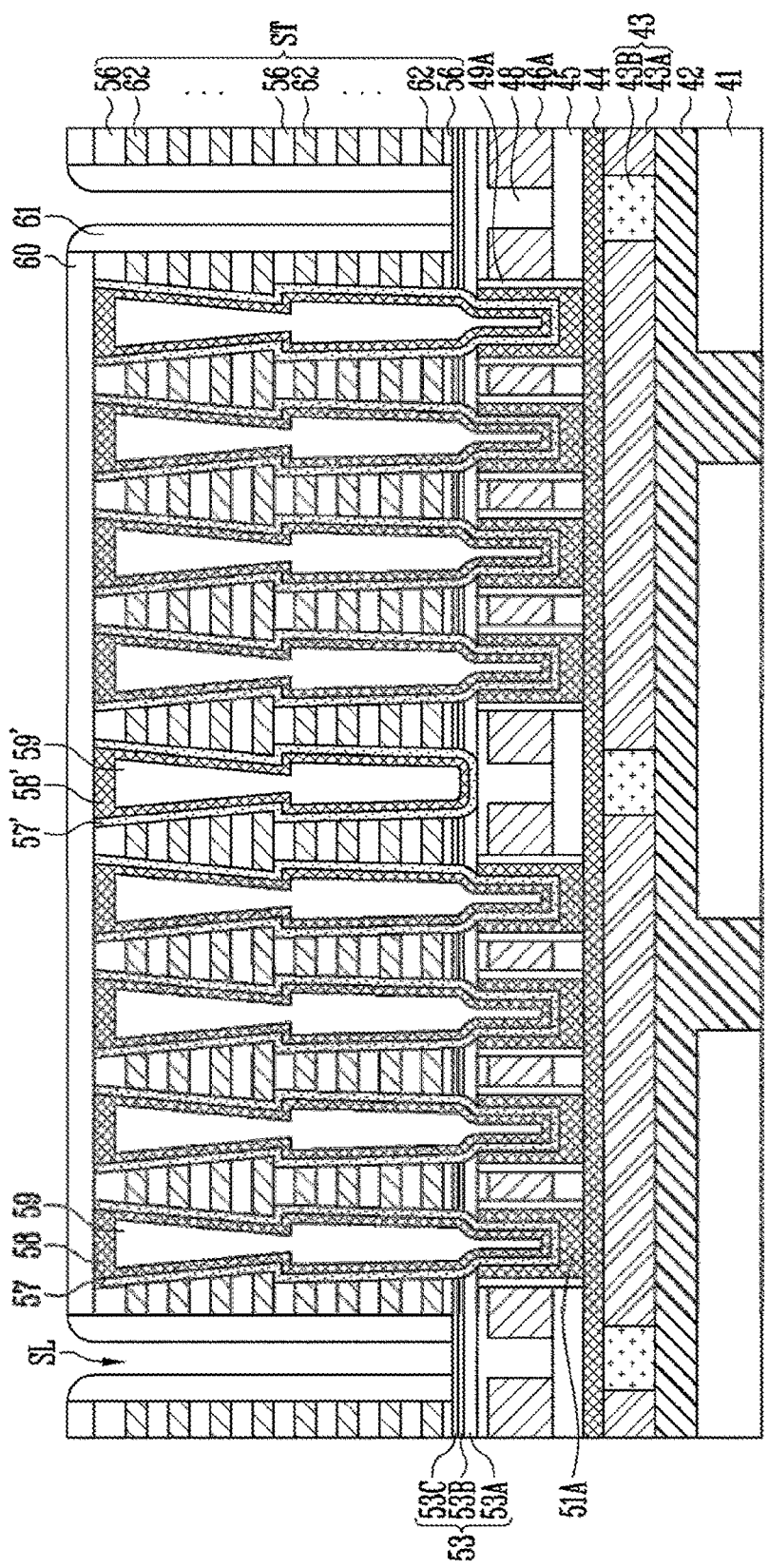

Referring to FIG. 3H, cell channel layers 58 are formed in the second openings OP2. In this case, a memory layers 57 may be formed before the cell channel layers 58 are formed. The memory layers 57 surround outer surfaces of the cell channel layers 58, and are interposed between the cell channel layers 58 and the source channel layers 51A. Each of the cell channel layers 58 includes an opened central region, and a gap fill insulating layer 59 may be filled in the opened central region of the cell channel layer 58. The gap fill insulating layers 59 may include poly silazane (PSZ). Accordingly, the cell channel layers 58 are formed, each of which includes a channel region penetrating the stack structure and a dummy region buried into the source channel layer 51A.

In addition, there may be formed a dummy cell channel layer 58' in the dummy opening D_OP, a dummy memory layer 57' surrounding an outer surface of the dummy cell channel layer 58', and a dummy gap fill layer 59' in the dummy cell channel layer 58'. Here, the dummy cell channel layer 58' may be simultaneously formed with the cell channel layer 58, the dummy memory layer 57' may be simultaneously formed with the memory layer 57, and the dummy gap fill layer 59' may be simultaneously formed with the gap fill layer 59.

Subsequently, an interlayer insulating layer 60 is formed on the stack structure ST, and slits SL penetrating the interlayer insulating layer 60 and the stack structure ST are then formed. For example, the first and second material layers 55 and 56 are etched such that the etch stop layer 53C is exposed, thereby forming the slits SL.

Subsequently, the first material layers 55 or the second material layers 56 are replaced with third material layers 62 through the slits SL. As an example, if the first material layers 55 are sacrificial layers and the second material layers 56 are insulating layers, the first material layers 55 are replaced with conductive layers. As another example, if the first material layers 55 are conductive layers and the second material layers 56 are insulating layers, the first material layers 55 are replaced with metal silicide layers. In this case, some of the first material layers 55 may be silicidized. As still another example, if the first material layers 55 are conductive layers and the second material layers 56 are sacrificial layers, the second material layers 56 are replaced with insulating layers. For reference, when the first material layers 55 are sacrificial layers and the second material layers 56 are insulating layers, the etch stop layer 53C in the sacrificial layer 53 may be removed together with the first material layers 55 during a process of removing the first material layers 55. In this case, the third material layer 62 may be formed in a region in which the etch stop layer 53C is removed, and the sacrificial layer 53 may include the buffer layer 53A and the sacrificial layer 53B.

Subsequently, a spacer 61 is formed on an inner wall of the slit SL. For example, an insulating layer is formed along a profile of the stack structure ST having the slit SL formed therein, and the spacer 61 is then formed by performing an etch-back process.

Figure 3I:
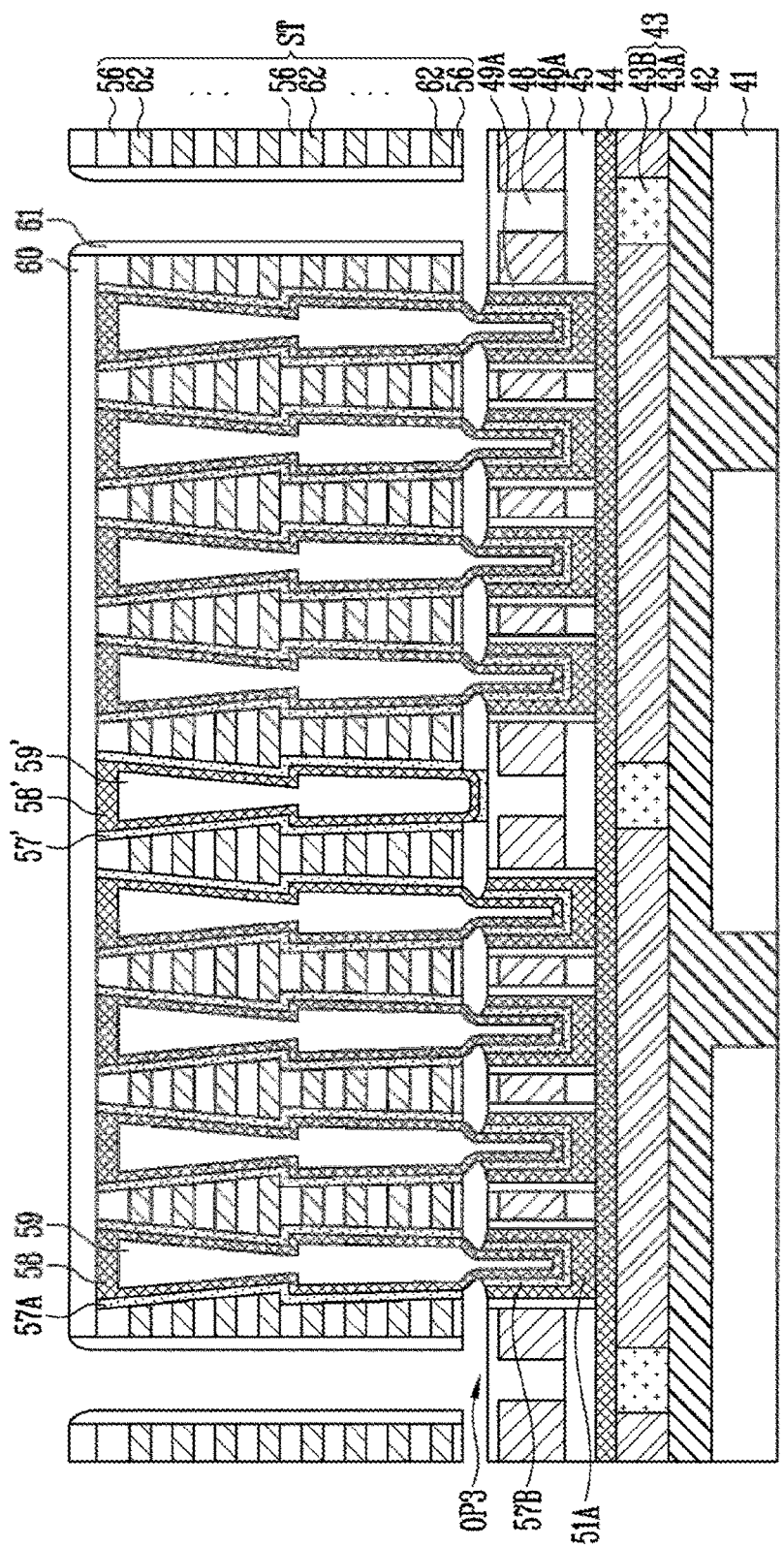

Referring to FIG. 3I, the sacrificial layer 53 is removed through the slits SL, thereby forming a third opening OP3. Subsequently, the memory layer 57 exposed through the third opening OP3 is etched, thereby forming a memory pattern 57A and a dummy memory pattern 57B. For example, the third opening OP3 is formed by removing the sacrificial layer 53B, and the buffer layer 53A and the memory layer 62, which are exposed through the third opening OP3, are then removed. Accordingly, the cell channel layer 58 is exposed in the third opening OP3. For reference, when the third opening OP3 is formed, the remaining etch stop layer 53C may be removed, or the third material layer 57 formed by replacing the etch stop layer 53C may be removed.

In addition, the dummy memory layer 57' surrounding the dummy cell channel layer 58' may be exposed through the third opening OP3, and the dummy cell channel layer 58' may be exposed as the dummy memory layer 57' is removed together with the memory layer 57 when the memory layer 57 is removed.

Figure 3J:
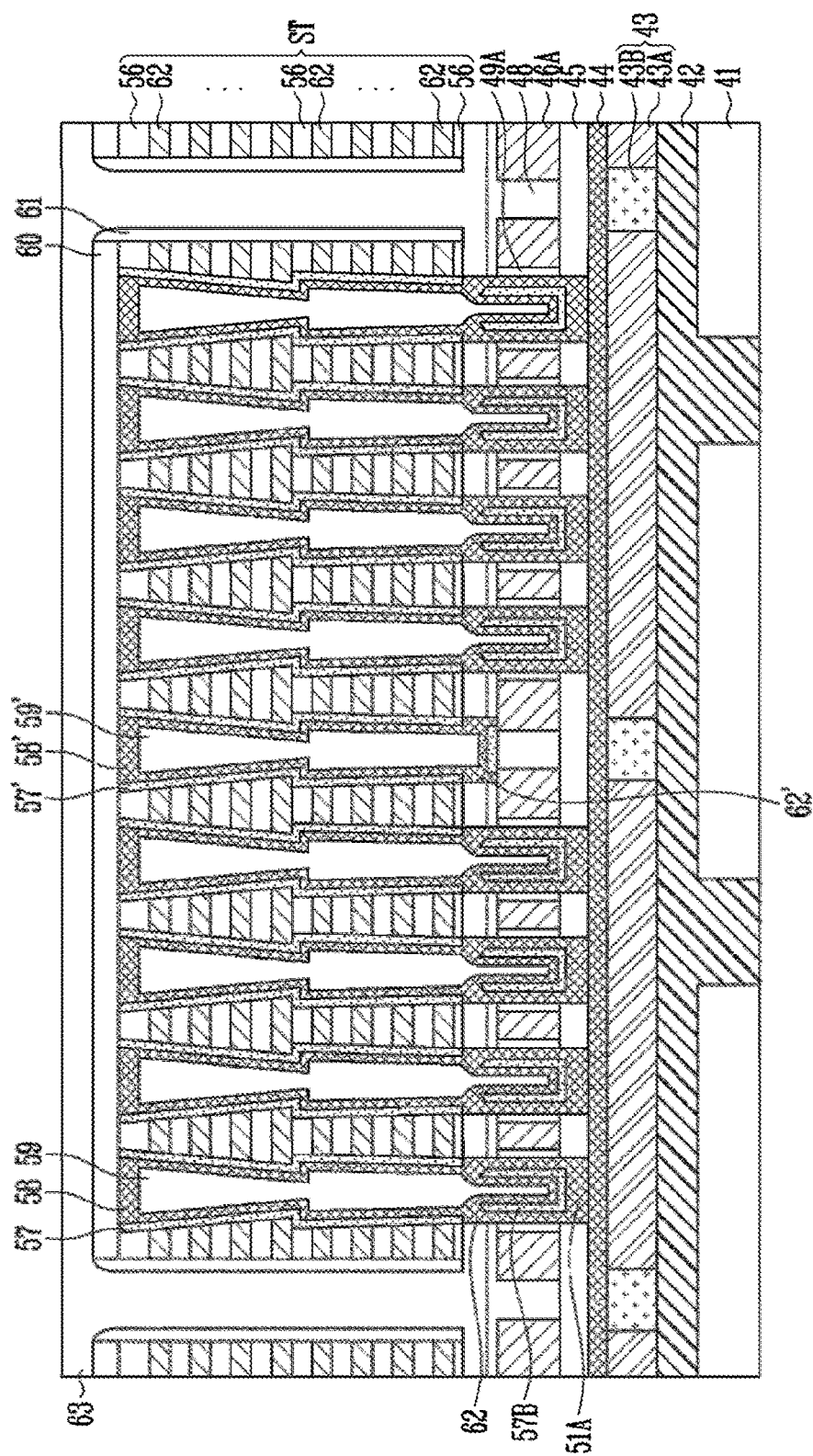

Referring to FIG. 3J, the source channel layer 51A and the cell channel layer 58, which are exposed through the third opening OP3, are connected to each other. For example, the source channel layer 51A and the cell channel layer 58 may be connected to each other by selectively growing or selectively depositing a channel layer 62 on the source channel layer 51A and the cell channel layer 58. In this case, the dummy channel layer 62' may also be selectively grown or selectively deposited on the dummy cell channel 58' exposed in the third opening OP3.

Subsequently, there is formed an insulating layer 63 filled in the third opening OP3 and the slits SL. The insulating layer 63 may include oxide. The insulating layer 63 may also be formed over the stack structure ST.

According to the above-described processes, the source select line and the word lines are formed through separate processes from each other, and thus the channel length of the source select transistor can be arbitrarily adjusted. Accordingly, it may be possible to control the leakage current of the source select transistor.

Further, the gate insulating pattern of the source select transistor includes no charge trap material, and thus it may be possible to prevent charges from being trapped in the gate insulating pattern even when program/erase operations are repeated. Accordingly, it may be possible to prevent the threshold voltage of the source select transistor from being changed.

Figure 4:
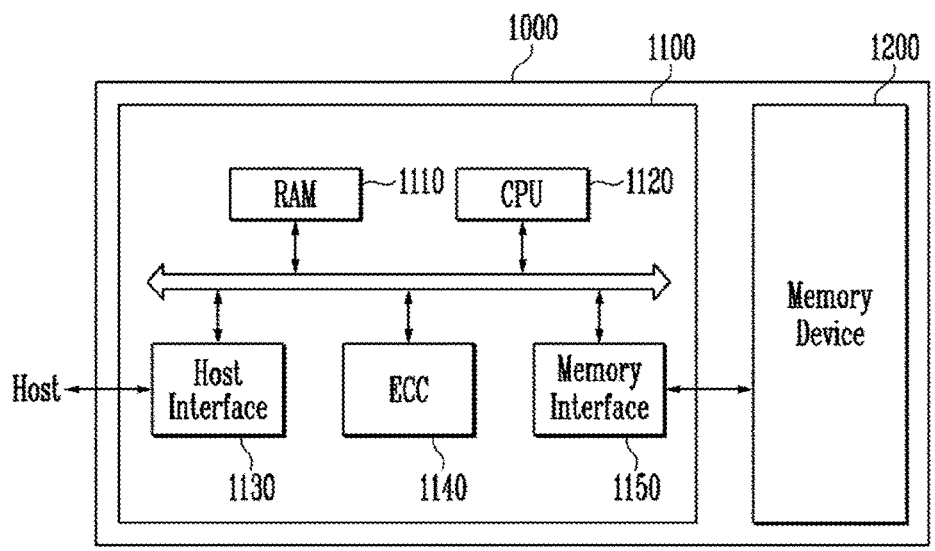
FIGS. 4 and 5 are block diagrams illustrating representations of examples of configurations of memory systems according to embodiments of the present disclosure.

FIG. 4 is a block diagram illustrating a representation of an example of a configuration of a memory system according to an embodiment of the present disclosure.

Referring to FIG. 4, the memory system 1000 according to an embodiment of the present disclosure includes a memory device 1200 and a controller 1100.

The memory device 1200 is used to store data information having various data formats such as texts, graphics, and software codes. The memory device 1200 may be a non-volatile memory, and may include the memory string described with reference to FIGS. 1A to 3J. Also, the memory device 1200 may be configured to include: a conductive layer for source and bulk lines; a sub-channel layer located on the conductive layer; a hole source layer interposed between the conductive layer and the sub-channel layer, the hole source layer including an impurity region connecting the sub-channel layer and the conductive layer; source select lines located on the sub-channel layer; and a source channel layer contacting the sub-channel layer by penetrating the source select lines. The structure and manufacturing method of the memory device 1200 are the same as described above, and therefore, their descriptions will be omitted.

The controller 1100 is connected to a host and the memory device 1200 and configured to access the memory device 1200 in response to a request from the host. For example, the controller 1100 is configured to control reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like.

Here, the RAM 1110 may be used as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), etc.

The CPU 1120 is configured to control the general operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial- ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

For reference, the controller 1100 may further include a buffer memory (not illustrated) for temporarily storing data. Here, the buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 according to an embodiment of the present disclosure includes the memory device 1200 having an improved degree of integration and improved characteristics, and thus it may be possible to improve the degree of integration and characteristics of the memory system 1000.

Figure 5:
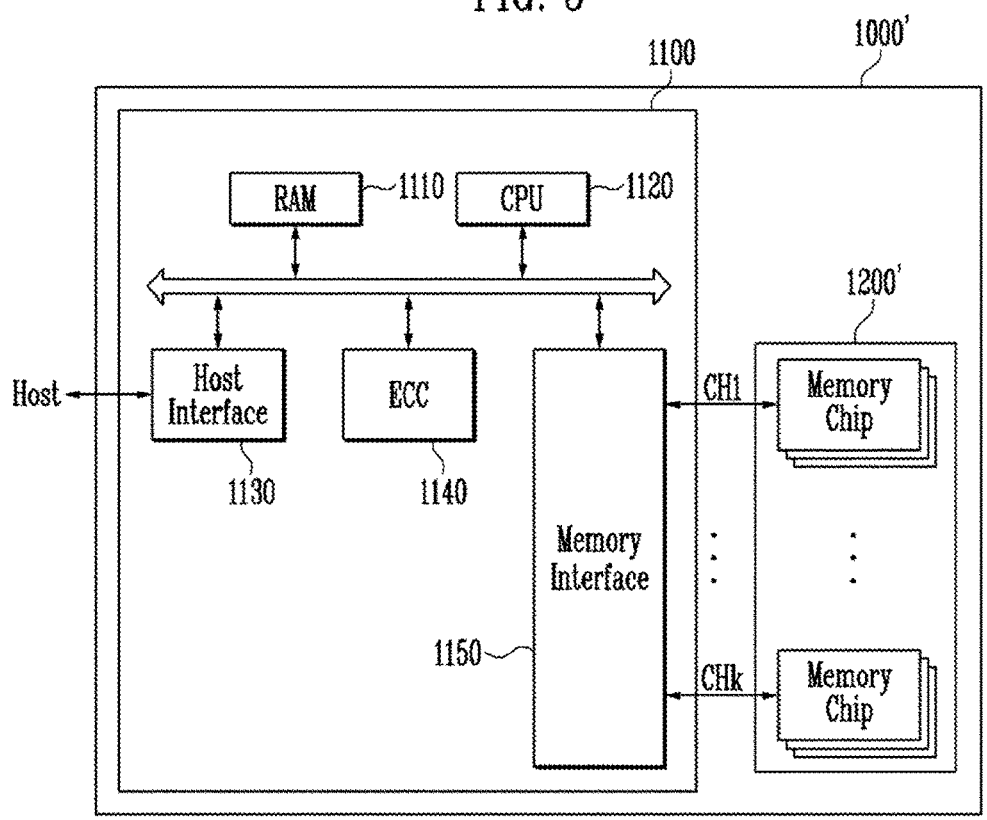

FIG. 5 is a block diagram illustrating a representation of an example of a configuration of a memory system according to an embodiment of the present disclosure. Hereinafter, description of contents overlapping with those described above will be omitted.

Referring to FIG. 5, the memory system 1000' according to an embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory, and may include the memory string described with reference to FIGS. 1A to 3J. Also, the memory device 1200' may be configured to include: a conductive layer for source and bulk lines; a sub-channel layer located on the conductive layer; a hole source layer interposed between the conductive layer and the sub-channel layer, the hole source layer including an impurity region connecting the sub-channel layer and the conductive layer; source select lines located on the sub-channel layer; and a source channel layer contacting the sub-channel layer by penetrating the source select lines. The structure and manufacturing method of the memory device 1200' are the same as described above, and therefore, their descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' according to an embodiment of the present disclosure includes the memory device 1200' having an improved degree of integration and improved characteristics, and thus it may be possible to improve the degree of integration and characteristics of the memory system 1000'. Particularly, the memory device 1200' is configured as a multi-chip package, so that it may be possible to increase the data storage capacity of the memory system 1000' and to improve the operation speed of the memory system 1000'.

Figure 6:
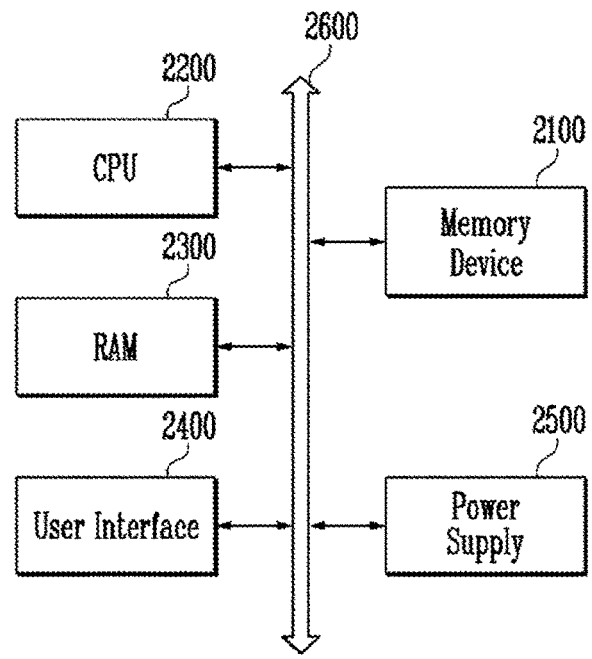
FIGS. 6 and 7 are block diagrams illustrating representations of examples of configurations of computing systems according to embodiments of the present disclosure.

FIG. 6 is a block diagram illustrating a representation of an example of a configuration of a computing system according to an embodiment of the present disclosure. Hereinafter, description of contents overlapping with those described above will be omitted.

Referring to FIG. 6, the computing system 2000 according to an embodiment of the present disclosure includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not illustrated) or directly. When the memory device 2100 is directly connected to the system bus 2600, a function of the controller may be performed by the CPU 2200, the RAM 2300, etc.

Here, the memory device 2100 may be a nonvolatile memory, and may include the memory string described with reference to FIGS. 1A to 3J. Also, the memory device 2100 may be configured to include: a conductive layer for source and bulk lines; a sub-channel layer located on the conductive layer; a hole source layer interposed between the conductive layer and the sub-channel layer, the hole source layer including an impurity region connecting the sub-channel layer and the conductive layer; source select lines located on the sub-channel layer; and a source channel layer contacting the sub-channel layer by penetrating the source select lines. The structure and manufacturing method of the memory device 2100 are the same as described above, and therefore, their descriptions will be omitted.

The memory device 2100 may be a multi-chip package including a plurality of memory chips as described with reference to FIG. 5.

The computing system 2000 configured as described above may be a computer, a ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 according to an embodiment of the present disclosure includes the memory device 2100 having an improved degree of integration and improved characteristics, and thus it may be possible to improve the degree of integration and characteristics of the computing system 2000.

Figure 7:
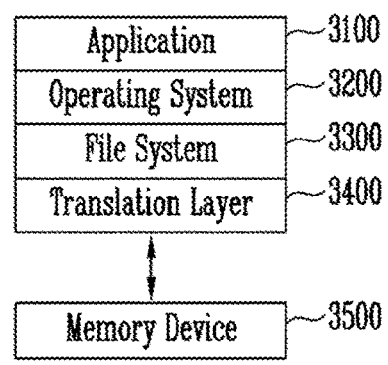

FIG. 7 is a block diagram illustrating a representation of an example of a computing system according to an embodiment of the present disclosure.

Referring to FIG. 7, the computing system 3000 according to an embodiment of the present disclosure includes a software layer including an operating system 3200, an application 3100, a file system 3300, a translation layer 3400, and the like. In addition, the computing system 3000 includes a hardware layer of a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are illustrated as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. For example, mapping information between the logical address and the physical address may be stored as an address translation table. For example, the translation layer 3400 may be a flash translation layer (FTL), a universal flash storage link layer (ULL), etc.

The memory device 3500 may be a nonvolatile memory, and may include the memory string described with reference to FIGS. 1A to 3J. Also, the memory device 3500 may be configured to include: a conductive layer for source and bulk lines; a sub-channel layer located on the conductive layer; a hole source layer interposed between the conductive layer and the sub-channel layer, the hole source layer including an impurity region connecting the sub-channel layer and the conductive layer; source select lines located on the sub-channel layer; and a source channel layer contacting the sub-channel layer by penetrating the source select lines. The structure and manufacturing method of the memory device 3500 are the same as described above, and therefore, their descriptions will be omitted.

The computing system 3000 configured as described above may be divided into an operating system layer performed in an upper level region and a controller layer performed in a lower level region. Here, the application 3100, the operating system 3200, and the file system 3300 are included in the operating system layer, and may be driven by the operation memory of the computing system 3000. In addition, the translation layer 3400 may be included in the operating system layer or the controller layer.

As described above, the computing system 3000 according to an embodiment of the present disclosure includes the memory device 3500 having an improved degree of integration and improved characteristics, and thus it may be possible to improve the degree of integration and characteristics of the computing system 3000.

According to the present disclosure, holes and a slit, which penetrate a stack structure, are simultaneously formed, patterns are uniformly distributed. Thus, the holes and the slit, which formed into a structure having a high aspect ratio, can be formed to have a uniform profile. Also, upper and lower portions of a channel pattern in the hole have a uniform width, and thus stacked memory cells have uniform characteristics. Also, widths of the holes and the slit can be decreased, thereby improving the degree of integration of a memory.

According to the present disclosure, the hole source layer and the sub-channel layer are located on the conductive layer for source and bulk lines, and the conductive layer and the sub-channel layers are connected to each other through the impurity region of the hole source layer. Thus, the path through which current flows and the path through which holes are supplied can be isolated from each other, and one conductive layer can serve as source and bulk lines. Further, the erase operation can be performed by selecting a bulk manner or a gate induced drain leakage (GIDL) manner.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a first conductive layer;
   a sub-channel layer located over the first conductive layer;
   a hole source layer interposed between the first conductive layer and the sub-channel layer, the hole source layer including an impurity region connecting the sub-channel layer and the first conductive layer;
   source select lines located over the sub-channel layer;
   source channel layers contacting the sub-channel layer by penetrating the source select lines; and
   a gate insulating pattern interposed between the source channel layers and the source select lines.

2. The semiconductor device of claim 1, wherein each of the source channel layers includes:
   a channel pattern contacting the sub-channel layer;
   a dummy memory pattern located in the channel pattern;
   a dummy channel pattern located in the dummy memory pattern; and
   a connecting pattern connecting the channel pattern and the dummy channel pattern to each other to isolate the dummy memory pattern.

3. The semiconductor device of claim 2, wherein each of the source channel layers includes a gap fill layer located in the dummy channel pattern.

4. The semiconductor device of claim 2, wherein the channel pattern, the dummy memory pattern, and the dummy channel pattern have a bowl shape.

5. The semiconductor device of claim 1, wherein the gate insulating pattern includes $Al_2O_3$.

6. A semiconductor device, comprising:
   a first conductive layer;
   a sub-channel layer located over the first conductive layer;
   a hole source layer interposed between the first conductive layer and the sub-channel layer, the hole source layer including an impurity region connecting the sub-channel layer and the first conductive layer;
source select lines located over the sub-channel layer;
source channel layers contacting the sub-channel layer by penetrating the source select lines;
second conductive layers stacked over the source select lines; and
cell channel layers each including a channel region penetrating the second conductive layers and a dummy region buried into the source channel layers.

7. The semiconductor device of claim 6, wherein the stack of second conductive layers includes at least one drain select line located at an uppermost second conductive layer among the second conductive layers and word lines respectively located at the other second conductive layers.

8. The semiconductor device of claim 6, further comprising a dummy cell channel layer penetrating the second conductive layers, the dummy cell channel layer being located between the cell channel layers, the dummy cell channel layer having a shallower depth than the cell channel layers.

9. The semiconductor device of claim 1, wherein the conductive layer is a metal layer, the hole source layer is a polysilicon layer including a P-type impurity, the sub-channel layer is an undoped polysilicon layer, and the impurity region includes an N-type impurity.

10. The semiconductor device of claim 1, wherein, during a read operation, a current flows through the source channel layer, the sub-channel layer, the impurity region, and the first conductive layer, wherein the first conductive layer is a source line.

11. The semiconductor device of claim 1, wherein, during an erase operation, an erase voltage is applied to the first conductive layer, and holes are supplied into the source channel layers from the hole source layer, wherein the first conductive layer is a bulk line.

12. A semiconductor device comprising:
a first conductive layer;
a sub-channel layer located over the first conductive layer;
a hole source layer interposed between the first conductive layer and the sub-channel layer, the hole source layer including an impurity region connecting the sub-channel layer and the first conductive layer;
source select lines located over the sub-channel layer;
source channel layers contacting the sub-channel layer by penetrating the source select lines; and
insulating layers located between the sub-channel layer and the source select lines and configured to insulate the sub-channel layer from the source select lines,
wherein the source channel layers contact the sub-channel layer by penetrating the source select lines and the insulation layers.

* * * * *